(12) United States Patent
Na et al.

(10) Patent No.: US 7,382,123 B2
(45) Date of Patent: Jun. 3, 2008

(54) MICRO FLUXGATE SENSOR AND METHOD OF MANUFACTURING THE SAME

(75) Inventors: Kyung-won Na, Yong-si (KR); Sang-on Choi, Suwon-si (KR); Hae-seok Park, Seoul (KR); Dong-sik Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 234 days.

(21) Appl. No.: 10/859,591

(22) Filed: Jun. 3, 2004

(65) Prior Publication Data

US 2005/0024050 A1   Feb. 3, 2005

Related U.S. Application Data

(63) Continuation-in-part of application No. 10/763,394, filed on Jan. 26, 2004, now Pat. No. 7,208,947.

(30) Foreign Application Priority Data

Jun. 4, 2003  (KR) .................... 10-2003-0036130

(51) Int. Cl.
*G01R 33/04* (2006.01)
*G01R 33/02* (2006.01)

(52) U.S. Cl. ...................... 324/253; 324/249
(58) Field of Classification Search ................ 324/249, 324/253, 244, 247, 254, 255
See application file for complete search history.

(56) References Cited

U.S. PATENT DOCUMENTS 5,583,474 A   12/1996   Mizoguchi et al.
5,642,046 A * 6/1997   Hawks ........................ 324/253
5,933,758 A   8/1999   Jain (Continued)

FOREIGN PATENT DOCUMENTS

JP     64001981 A  *  1/1989

(Continued)

OTHER PUBLICATIONS

Liakopoulos, T.M., et al., "A micro-fluxgate magnetic sensor using micromachined planar solenoid coils", Sensors & Actuators A, Elsevier Sequoia, S.,A. Lausanne, CH (Swizterland), vol. 77, No. 1, pp. 66-72, (Sep. 28, 1999).

(Continued)

*Primary Examiner*—Patrick Assouad
*Assistant Examiner*—David M. Schindler
(74) *Attorney, Agent, or Firm*—Lee & Morse, P.C.

(57)   ABSTRACT

A micro-machining method of manufacturing a micro fluxgate sensor manufactured having an amorphous magnetic core includes forming lower coils of an excitation coil and a magnetic field detecting coil on a wafer, depositing a first insulating layer on the lower coils and forming an amorphous magnetic core, depositing a second insulating layer on the amorphous magnetic core and forming upper coils connected to the lower coils to complete the excitation coil and the magnetic field detecting coil, and covering the excitation coil and the magnetic field detecting coil with a protective film, and etching the protective film to expose a portion of the excitation coil and magnetic field detecting coil, thereby forming a pad.

20 Claims, 12 Drawing Sheets

U.S. PATENT DOCUMENTS

| | | | |
|---|---|---|---|
| 6,078,239 A * | 6/2000 | Hu | 336/82 |
| 6,411,086 B1 * | 6/2002 | Choi et al. | 324/253 |
| 6,429,651 B1 | 8/2002 | Choi et al. | |
| 6,690,164 B1 | 2/2004 | Fedeli et al. | |
| 6,725,528 B1 | 4/2004 | Nishi | |
| 2004/0027121 A1 * | 2/2004 | Choi et al. | 324/253 |

FOREIGN PATENT DOCUMENTS

| | | |
|---|---|---|
| JP | 08-179023 | 7/1996 |
| JP | 10-321561 | 12/1998 |
| JP | 2001-015367 | 1/2001 |
| JP | 2001-084510 | 3/2001 |
| JP | 2001-099654 | 4/2001 |
| JP | 2001-110639 | 4/2001 |

OTHER PUBLICATIONS

Shim, Dong-Sik, et al., "Micro fluxgate sensor using solenoid driving and sensing coils", Optoelectronic and Microelectronic Materials and Devices, 2002, Piscataway, NJ, USA, IEEE, pp. 237-240, (Dec. 11, 2002).

* cited by examiner

MICRO FLUXGATE SENSOR AND METHOD OF MANUFACTURING THE SAME

CROSS REFERENCE TO RELATED APPLICATION

This application is a Continuation-in-Part of application Ser. No. 10/763,394, filed Jan. 26, 2004, now U.S. Pat. No. 7,208,947 B2, issued Apr. 24, 2007, the entire contents of which are hereby incorporated by reference.

BACKGROUND OF THE INVENTION

1. Field of the Invention

The present invention generally relates to a micro fluxgate sensor. More particularly, the present invention relates to a micro fluxgate sensor manufactured by a micro-machining technique using an amorphous magnetic core and a method of manufacturing the same.

2. Description of the Related Art

A fluxgate sensor is a device that detects magnetic energy, which is not perceivable by human sense organs. Such a magnetic detection sensor may be used in applications that require detection of a magnetic energy formed around a circumference. For example, these applications may include position identification of airplanes, vessels and vehicles, motion detection in a virtual reality space, geomagnetic compensation and dot noise compensation for high definition television (HDTV), magneto-encephalograph (MEG) measurement acquisition in a medical device, and others. Recently, since the fields of application have gradually spread, there has been a trend toward providing devices that are thinner, lighter and less expensive. Correspondingly, there has been an attempt to provide a fluxgate sensor that is thinner, lighter and less expensive.

A micro fluxgate sensor primarily includes a core made of soft magnetic material, an excitation coil wound around the core for inducing a magnetic field when a current is applied thereto, and a magnetic field detecting coil for detecting an effect of an external magnetic field on the magnetic field induced by the excitation coil. A basic detecting principle utilizes a nonlinear characteristic of the soft magnetic core, i.e., a saturation characteristic. If a proper alternating current (AC) is applied to the excitation coil to induce the magnetic field, a flux density in the core is periodically saturated. At that time, if the external magnetic field to be measured is applied, the flux density of the core varies. The magnetic field detecting coil measures a variation of the flux to determine a dimension, either strength or direction, of the external magnetic field.

In order to manufacture a micro fluxgate sensor, a coil is generally wound around a large, bar-type core or a ring-type core of a soft magnetic ribbon. Accordingly, the core itself becomes relatively large, thereby enlarging a volume of the core and increasing a manufacturing cost of the core. In addition, since the flux variation generated by the excitation coil and the detected magnetic field do not prevent a flux leakage due to the core, highly sensitive detection of the magnetic field is not readily achieved.

Recently, a method utilizing a layering technique of a printed circuit board has been developed to manufacture a thinner and lighter fluxgate sensor.

According to the method utilizing the layering technique of the printed circuit board, an insulating layer and a copper plate are bonded to either side of a soft magnetic core, thereby producing an excitation coil and a magnetic field detecting coil, each wound around the core. In this method, since the core must be drilled to wind the coil around the core, the device may be damaged during the drilling process. Regarding another disadvantage, it is more difficult to downsize a fluxgate sensor manufactured according to this method as compared to one produced by a micro-machining technique.

SUMMARY OF THE INVENTION

In an effort to overcome at least some of the above-mentioned problems, it is a feature of an embodiment of the present invention to provide a micro fluxgate sensor capable of accurately detecting a magnetic field, in which an excitation coil and a magnetic field detecting coil are manufactured by a micro-machining technique using an amorphous magnetic core.

It is another feature of an embodiment of the present invention to provide a method of manufacturing such a micro fluxgate sensor.

To provide the above and other features of the present invention, a micro fluxgate sensor includes an amorphous magnetic core formed on a wafer on which a seed layer is deposited, an excitation coil wound around the amorphous magnetic core, a magnetic field detecting coil wound around the excitation coil and the amorphous magnetic core, a protective film formed on the excitation coil and the magnetic field detecting coil, and a pad, which is formed by etching the protective film, exposing a portion of the excitation coil and magnetic field detecting coil.

According to another aspect of the present invention, there is provided a method of manufacturing a micro fluxgate sensor including forming lower coils of an excitation coil and a magnetic field detecting coil on a wafer, depositing a first insulating layer on the lower coils and forming an amorphous magnetic core, depositing a second insulating layer on the amorphous magnetic core and forming upper coils connected to the lower coils to complete the excitation coil and the magnetic field detecting coil, and covering the excitation coil and the magnetic field detecting coil with a protective film, and etching the protective film to expose a portion of the excitation coil and magnetic field detecting coil, thereby forming a pad.

Forming the lower coils of the excitation coil and the magnetic field detecting coil on the wafer may include cleaning the wafer and forming a first seed layer, forming a first photoresist film pattern on the first seed layer, electroplating a coil material between the first photoresist film patterns, and removing the first photoresist film pattern so that the coil material remains, thereby forming the lower coils of the excitation coil and magnetic field detecting coil. Preferably, the coil material is copper (Cu).

Depositing the first insulating layer on the lower coils and forming the amorphous magnetic core may include etching the first seed layer on which the first photoresist film pattern is removed, depositing a first insulating layer on the etched portion of the first seed layer and the lower coils, bonding an amorphous magnetic film to the first insulating layer, forming a second photoresist film pattern on the amorphous magnetic film, removing the amorphous magnetic film, with a portion protected by the second photoresist film pattern remaining, and removing the second photoresist film pattern to form the amorphous magnetic core. Preferably, the amorphous material comprises cobalt (Co) having a DC permeability of about 100,000.

Depositing a second insulating layer on the amorphous magnetic core and forming upper coils connected to the lower coils to complete the excitation coil and the magnetic field detecting coil may include depositing a second insulating layer on the amorphous magnetic core and the first insulating film, depositing a second seed layer on the second insulating layer, forming a via hole extending to the lower coil through the second seed layer and the second insulating layer, forming a third photoresist film pattern on the second seed layer, electroplating the coil material between the third photoresist film patterns to connect the coil material with the lower coil through the via hole, and removing the third photoresist film pattern so that the coil material remains, thereby completing the excitation coil and magnetic field detecting coil.

Covering the coils with the protective film and forming the pad may include etching the second seed layer from which the third photoresist film pattern has been removed, depositing a third insulating layer on the etched portion of the second seed layer and the upper coil to form the protective film, and patterning the protective film to expose a portion of the upper coil to form the pad.

In the present invention, the amorphous magnetic core may either be two bar-type amorphous magnetic cores or formed in a rectangular ring shape. In either case, the excitation coil may be wound around the amorphous magnetic core in a substantially figure-eight pattern.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
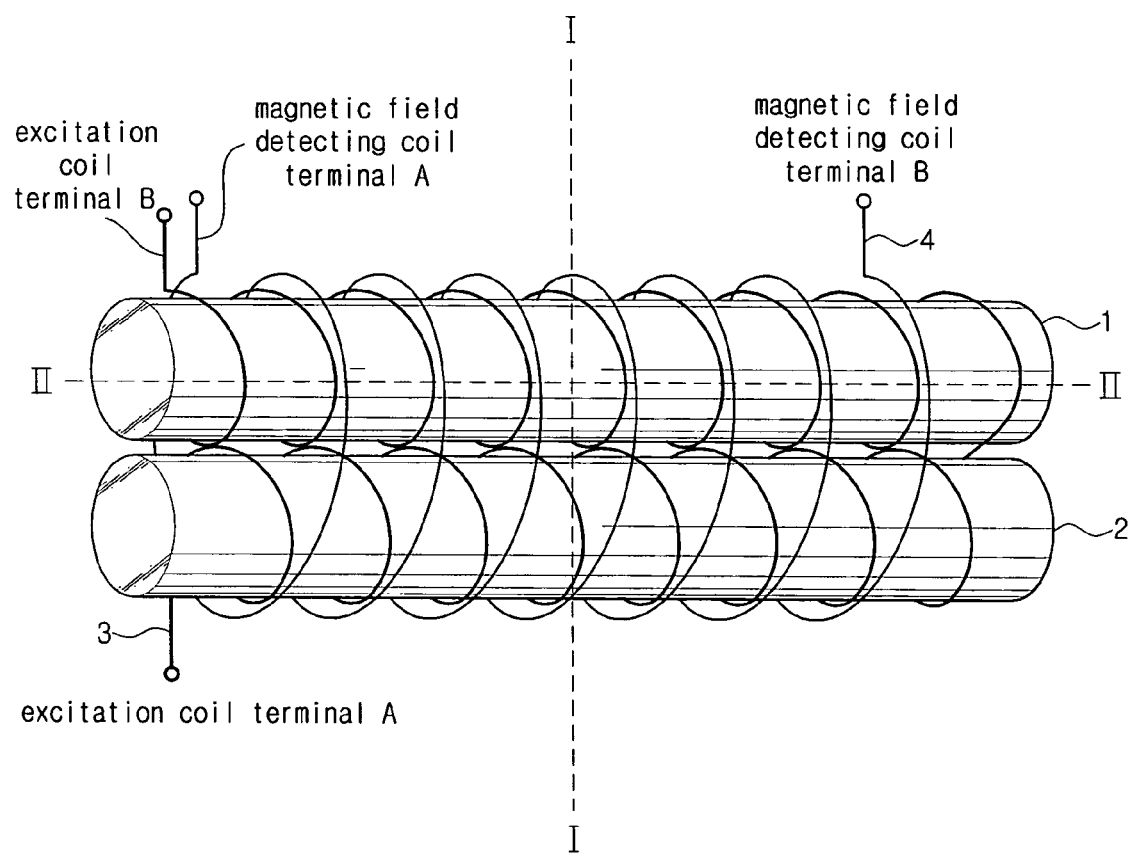
FIG. 1 illustrates a schematic view of a micro fluxgate sensor according to a preferred embodiment of the present invention.

Korean Patent Application No. 2003-36130, filed Jun. 4, 2003, and entitled: "Micro Fluxgate Sensor and Method of Manufacturing the Same," is incorporated by reference herein in its entirety.

A micro fluxgate sensor and a method of manufacturing the same according to the present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals refer to like elements throughout.

FIG. 1 illustrates a schematic view of a basic structure of a micro fluxgate sensor according to a preferred embodiment of the present invention. Referring to FIG. 1, the micro fluxgate sensor includes first and second bar-type amorphous magnetic cores 1 and 2, an excitation coil 3 wound around the first and second magnetic cores 1 and 2, and a magnetic field detecting coil 4 wound around the excitation coil 3 and the first and second magnetic cores 1 and 2.

Figure 2:
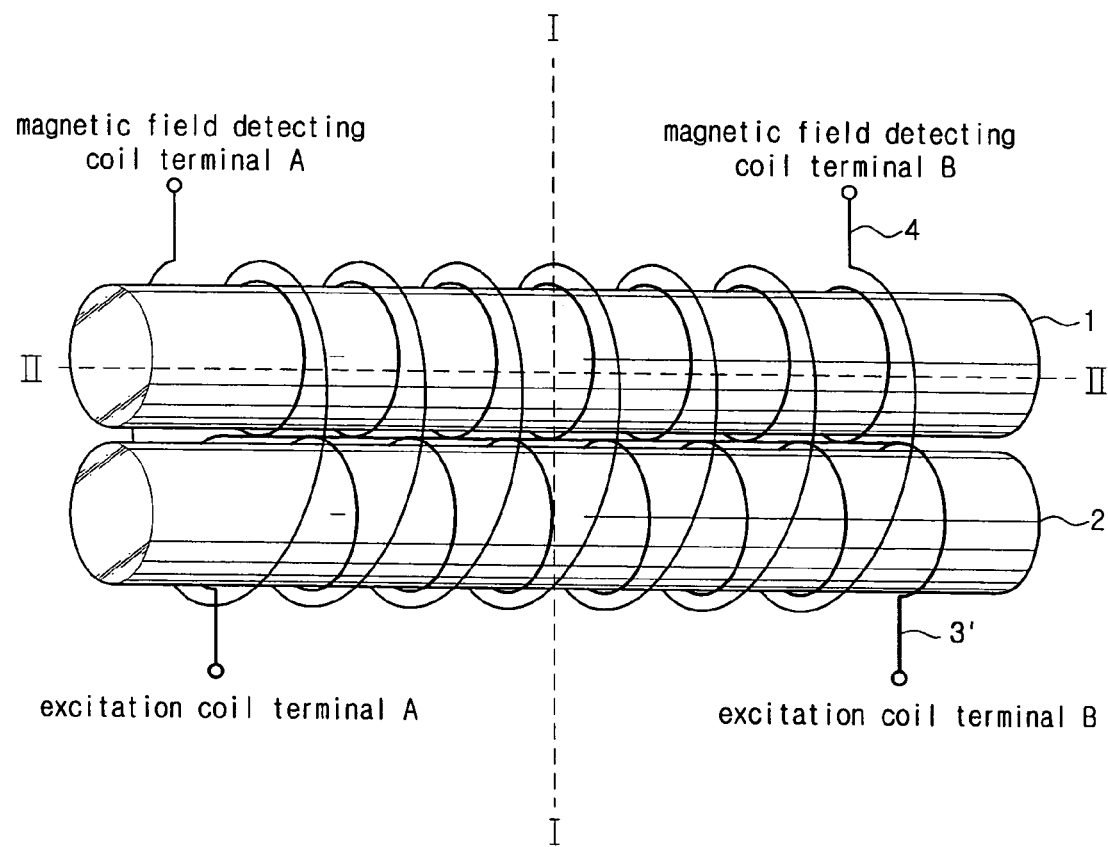
FIG. 2 illustrates a schematic view of a micro fluxgate sensor according to an alternate preferred embodiment of the present invention.

FIG. 2 illustrates a schematic view of a micro fluxgate sensor according to an alternate preferred embodiment of the present invention. Referring to FIG. 2, the micro fluxgate sensor includes first and second bar-type amorphous magnetic cores 1 and 2, an excitation coil 3' wound around the first and second magnetic cores 1 and 2 in a substantially figure-eight pattern, and a magnetic field detecting coil 4 wound around the excitation coil 3' and the first and second magnetic cores 1 and 2.

Figure 3A:
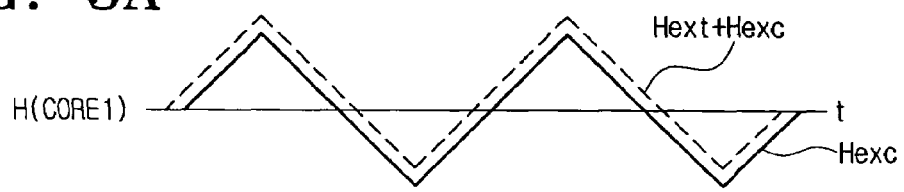
FIGS. 3A through 3F are waveform diagrams for explaining an operation of detecting a magnetic field in a micro fluxgate sensor according to an embodiment of the present invention.
Figure 3B:
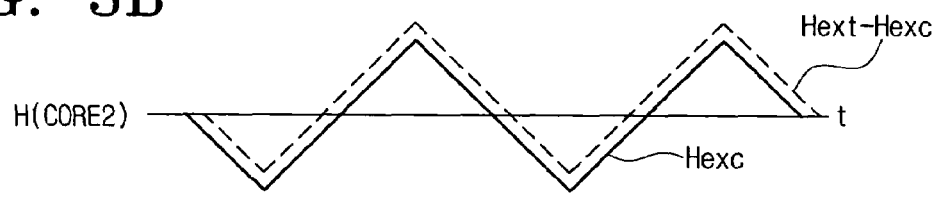
Figure 3C:
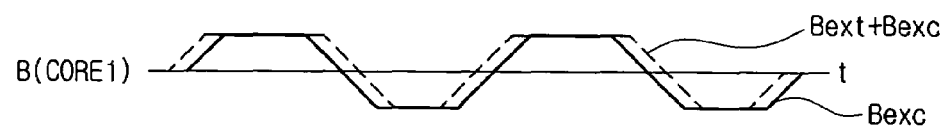
Figure 3D:
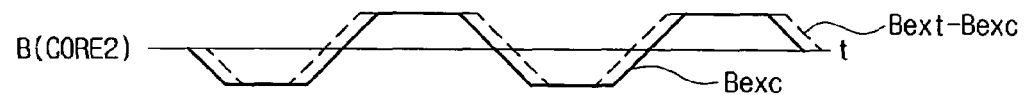
Figure 3E:
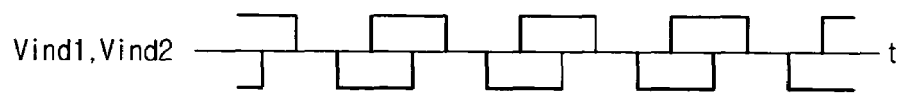
Figure 3F:
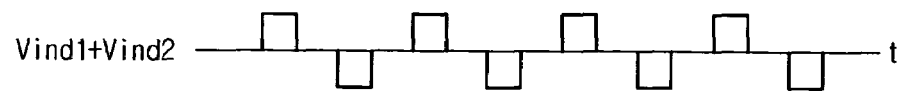

FIGS. 3A through 3F are waveform diagrams for explaining an operation of a fluxgate sensor according to an embodiment of the present invention. FIG. 3A is a waveform of a magnetic field H(CORE1) generated from the first amorphous magnetic core 1. FIG. 3B is a waveform of a magnetic field H(CORE2) generated from the second amorphous magnetic core 2. FIG. 3C is a waveform of a flux density B(CORE1) generated from the first amorphous magnetic core 1. FIG. 3D is a waveform of a flux density B(CORE2) generated from the second amorphous magnetic core 2. FIGS. 3E and 3F are waveforms of first and second induction voltages Vind1 and Vind2, and a sum (Vind1+Vind2) of the first and second induction voltages, respectively.

Application of a current to the excitation coil 3 or 3' of either embodiment of the present invention, which is wound around the first amorphous magnetic core 1, induces a magnetic field Hexc at the first amorphous magnetic core 1. A sum of an external magnetic field Hext and the induced magnetic field Hexc results in Hext+Hexc, as shown in FIG. 3A. In addition, that application of current induces a magnetic field −Hexc at the second amorphous magnetic core 2. A sum of the external magnetic field Hext and the induced magnetic field −Hexc results in Hext−Hexc, as shown in FIG. 3B. Here, Hext is the external magnetic field and Hexc is the magnetic field induced by the excitation coil 3 or 3'.

FIGS. 3C and 3D depict a flux density Bexc generated at the first amorphous magnetic core 1, Bext+Bexc, which represents an effect due to the external magnetic field on the first amorphous magnetic core 1, a flux density −Bexc generated at the second amorphous magnetic core 2, and Bext−Bexc, which represents an effect due to the external magnetic field on the second amorphous magnetic core 2.

Here, Bext is the flux density caused by the external magnetic field, and Bexc is the flux density caused by the excitation coil 3.

The magnetic field detecting coil 4 is wound to obtain the sum of variation of the magnetic flux in each of the cores 1 and 2, and to detect the flux variation by the electronic induction caused by the AC excitation current. Since the induction voltage at the magnetic field detecting coil 4 has internal magnetic fields acting in opposite directions, the induction voltage detected at the magnetic field detecting coil 4 is a result of offsetting the two symmetrically generated induction voltages Vind1 and Vind2, as may be seen in FIG. 3F. More specifically, because the external magnetic field Hext acts in a same direction with respect to the first and second bar-type amorphous magnetic cores 1 and 2, the internal magnetic fields generated from the first and second amorphous magnetic cores 1 and 2 are Hext+Hexc and Hext−Hexc. As shown in FIG. 3E, the voltages Vind1 and Vind2 are induced at the magnetic field detecting coil 4, respectively. Thus, as shown in FIG. 3F, the two induction voltages are mutually offset, and by detecting the sum of the induction voltages Vind1 and Vind2, the magnitude of the external magnetic field Hext may be obtained.

Figure 4A:
FIGS. 4A through 4O illustrate cross-sectional views taken along a line I-I of the micro fluxgate sensors shown in either FIG. 1 of FIG. 2.
Figure 4B:
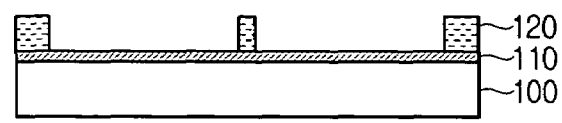
Figure 4C:
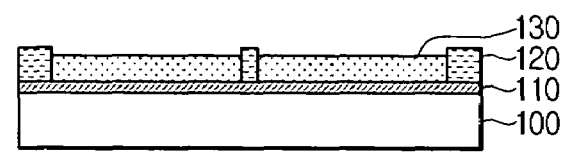
Figure 4D:
Figure 4E:
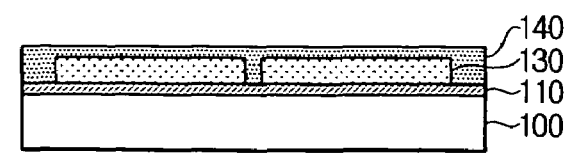
Figure 4F:
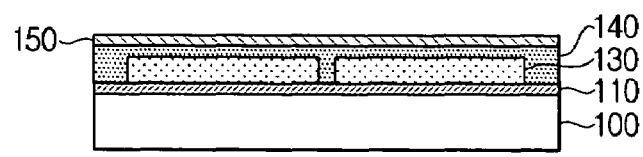
Figure 4G:
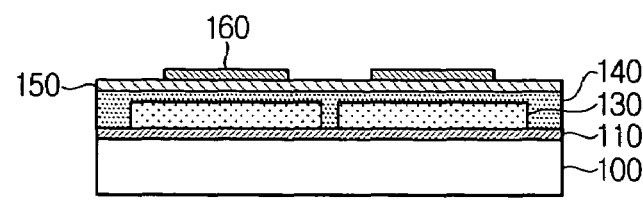
Figure 4H:
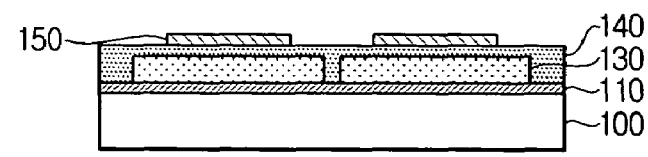
Figure 4I:
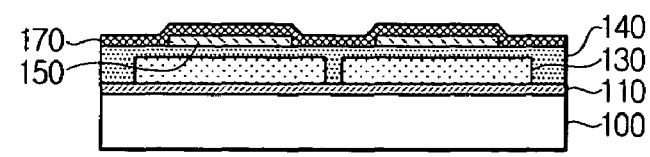
Figure 4J:
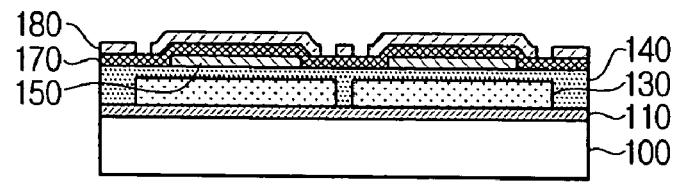
Figure 4K:
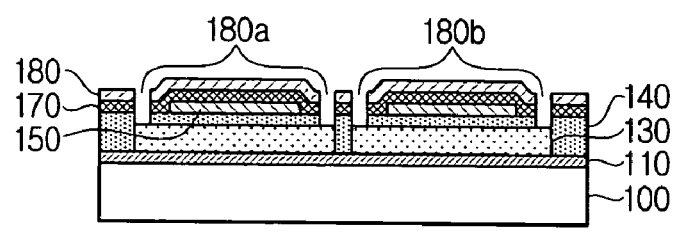
Figure 4L:
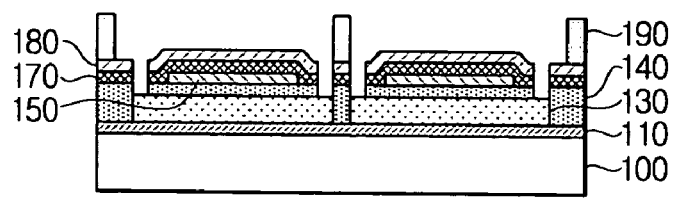
Figure 4M:
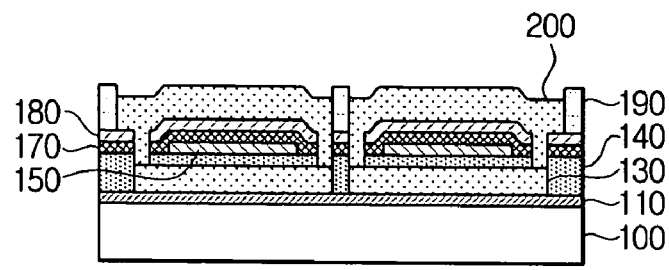
Figure 4N:
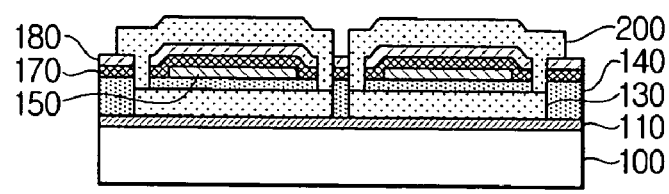
Figure 4O:
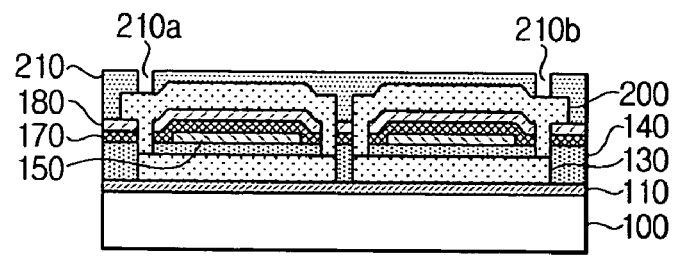
Figure 5A:
FIGS. 5A through 5N illustrate cross-sectional views taken along a line II-II of the micro fluxgate sensors shown in either FIG. 1 of FIG. 2.
Figure 5B:
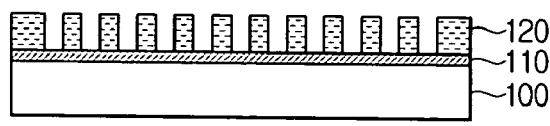
Figure 5C:
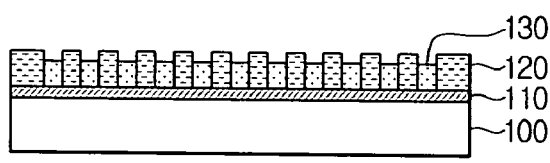
Figure 5D:
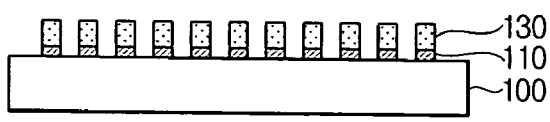
Figure 5E:
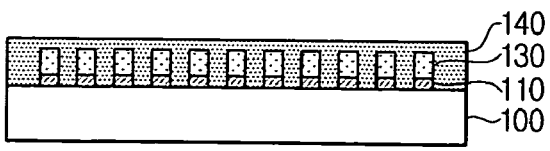
Figure 5F:
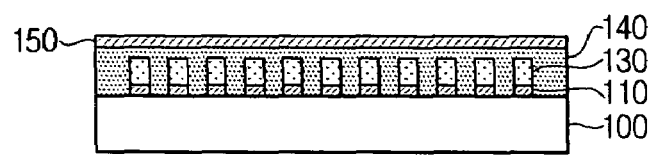
Figure 5G:
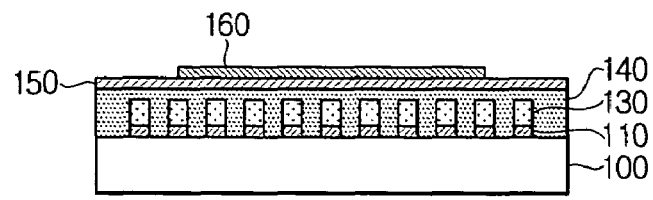
Figure 5H:
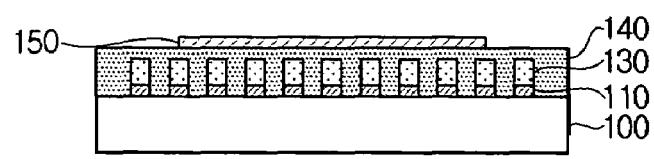
Figure 5I:
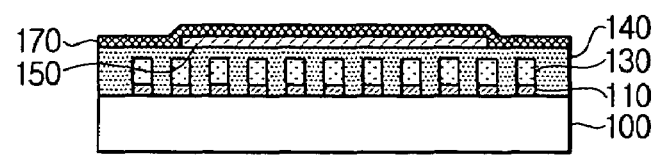
Figure 5J:
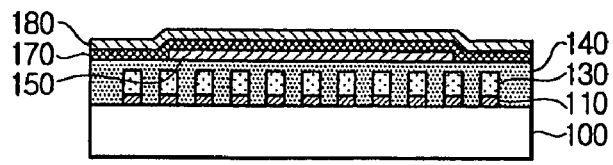
Figure 5K:
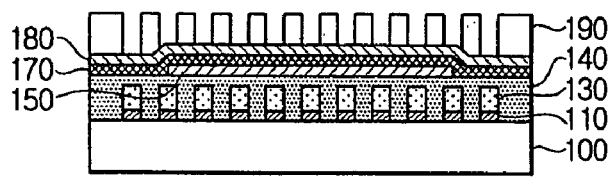
Figure 5L:
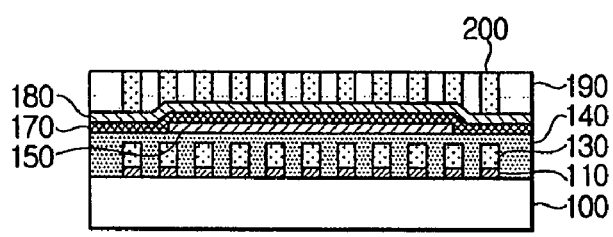
Figure 5M:
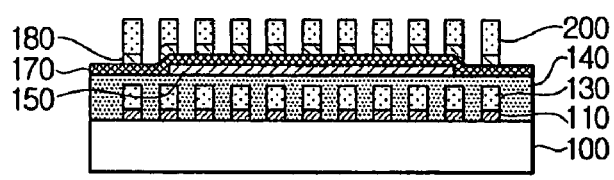
Figure 5N:
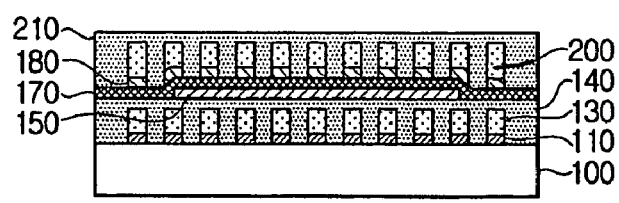

FIGS. 4O and 5N illustrate cross-sectional views of a micro fluxgate sensor according to an embodiment of the present invention. FIG. 4O illustrates a cross-sectional view taken along a line I-I of the micro fluxgate sensor shown in either FIG. 1 or FIG. 2. FIG. 5N illustrates a cross-sectional view taken along a line II-II of the micro fluxgate sensor shown in either FIG. 1 or FIG. 2.

Referring to FIGS. 4O and 5N, a seed layer 110 is deposited on a silicon wafer 100, and a lower coil 130 is formed on the seed layer 110 at predetermined intervals. The lower coil 130 is bonded to an upper coil 200 formed during a subsequent step to form a coil. The coil may either be used as an excitation coil or a magnetic field detecting coil depending upon a predetermined manufacturing criteria.

According to an embodiment of the present invention, the coil is formed in a batch, without performing a separate step of manufacturing the magnetic field detecting coil, and is divided into the excitation coil and the magnetic field detecting coil by varying the connection between the coils. For example, either an even-numbered coil may be used as the excitation coil, while an odd-numbered coil is used as the magnetic field detecting coil, or vice versa. Such use can be achieved by connecting only the coils to be used as the excitation coil and only the coils to be used as the magnetic field detecting coil, respectively, and connecting them with an external terminal through each pad, during a process of connecting the coils.

According to another embodiment of the present invention, if one of the two bar-type cores is referred to as a first core and the other is referred to as a second core, a lower coil of the first core is connected to an upper coil of the second core, the upper coil of the second core is connected to a lower coil of the second core, and the lower coil of the second core is connected to an upper coil of the first core. If the above process is repeated, two bar-type cores consisting of excitation coils are constructed in a substantially figure-eight pattern.

An intermediate portion of the coil is divided into two portions by a first insulating layer 140. An amorphous magnetic core 150 is positioned in the respective divided portions of the coil. The first insulating layer 140 and a second insulating layer 170 are formed between the magnetic core 150 and the coil in such a way that the magnetic core 150 is spaced a predetermined distance apart from the coil. A protective film 210 is deposited on the coil as a third insulating layer. The protective layer is etched to form via holes 210*a* and 210*b* for exposing the pad connecting the coil and an external terminal.

A manufacturing process of the micro fluxgate sensor according to a preferred embodiment of the present invention will now be described with reference to FIGS. 4A through 4O and FIGS. 5A through 5N.

Referring now to FIGS. 4A and 5A, after cleaning a silicon wafer 100, a first seed layer 110 is formed on an upper surface of the silicon wafer 100. The first seed layer 110 will be used to form a coil using a subsequent electroplating process.

Referring to FIGS. 4B and 5B, a first photoresist film pattern 120 is formed on the first seed layer 110. The first photoresist film 120 will subsequently act as a mold in the manufacture of a lower portion 130 of the coil.

As shown in FIGS. 4C and 5C, the coil material 130 is electroplated between the first photoresist film patterns 120. Copper (Cu) is generally used as the coil material. Subsequently, the first photoresist film pattern 120 is removed to form the lower coil portions 130 arranged in two rows, as shown in FIGS. 4D and 5D.

An anisotropic etching is performed on only the first seed layer 110 on at a location from which the first photoresist film pattern 120 has been removed. Then, a first insulating layer 140 is deposited on the etched portion of the first seed layer 110 and the lower coil portions 130 to form the structure as shown in FIGS. 4E and 5E. The first insulating layer 140 will isolate the core portion 150 from the lower and upper coils 130 and 200.

Referring to FIGS. 4F and 5F, an amorphous magnetic film 150 is adhered to the first insulating layer 140 using an adhesive. The amorphous magnetic film 150 will be patterned to produce the core. Since amorphous magnetic film 150 has no magnetocrystalline anisotropy, the resultant core has advantages of easy magnetization, a small coercive force, and very small hysteresis loss. The amorphous magnetic film 150 may include an amorphous material, of which cobalt (Co) having a DC permeability of about 100,000 is a main component.

Referring to FIGS. 4G and 5G, a second photoresist film pattern 160 is deposited on the amorphous magnetic film 150. The amorphous magnetic film 150 is then patterned to produce the core. More specifically, the second photoresist film pattern 160 is deposited in a shape of two bars according to a preferred embodiment of the present invention. Alternately, the second photoresist film pattern 160 may be deposited in a shape of a rectangular ring, according to an alternate embodiment of the present invention. Then, the amorphous magnetic film 150, which is not protected by the second photoresist film pattern 160, is removed, and the second photoresist film pattern 160 is also removed, thereby forming the structure as shown in FIG. 4H and FIG. 5H.

Referring to FIGS. 4I and 5I, a second insulating layer 170 is deposited on the core 150 and the first insulating film 140. The second insulating layer 170 will isolate the core 150 from an upper coil 200 to be deposited in a subsequent step.

Then, as shown in FIGS. 4J and 5J, a second seed layer 180 is deposited and patterned on the second insulating layer 170. The second seed layer 180 will be used to form the upper coil 200 by electroplating in a subsequent step. The patterning process is to form a passage from the upper coil 200 to the lower coil 130 in a subsequent step.

Referring to FIG. 4K, the second and first insulating layers 170 and 140 are etched through the passage formed by patterning the second seed layer 180 to form via holes 180*a* and 180*b*. The via holes are not visible in the cross-sectional view taken along a line II-II.

Subsequently, as shown in FIGS. 4L and 5K, a third photoresist film pattern 190 is formed on the second seed layer 180. The third photoresist film pattern 190 will act as a mold in the subsequent formation of the upper coil 200. The third photoresist film pattern 190 is formed at a position corresponding to where the first photoresist film pattern 120 was formed in FIGS. 4B and 5B, but may be formed at a different position if the coil is to be wound in a substantially figure-eight pattern as shown in the alternate preferred embodiment of the present invention.

Referring to FIGS. 4M and 5L, the upper coil 200 is electroplated between the third photoresist film patterns 190. A material used for the upper coil and the electroplating method thereof may be substantially the same as that used to form the lower coil 130.

Next, referring to FIGS. 4N and 5M, the third photoresist film pattern 190 is removed, thereby leaving the upper coil 200 alone. Then, the second seed layer 180 is removed from a place where the third photoresist film pattern 190 has been removed. Finally, referring again to FIGS. 4O and 5N, the third insulating layer 210 is deposited over the resultant structure to form a protective layer. The third insulating layer 210 is then etched partially to expose a portion of the upper coil 200, thereby forming pads 210*a*, 210*b* for connecting with the external terminals.

Figure 6:
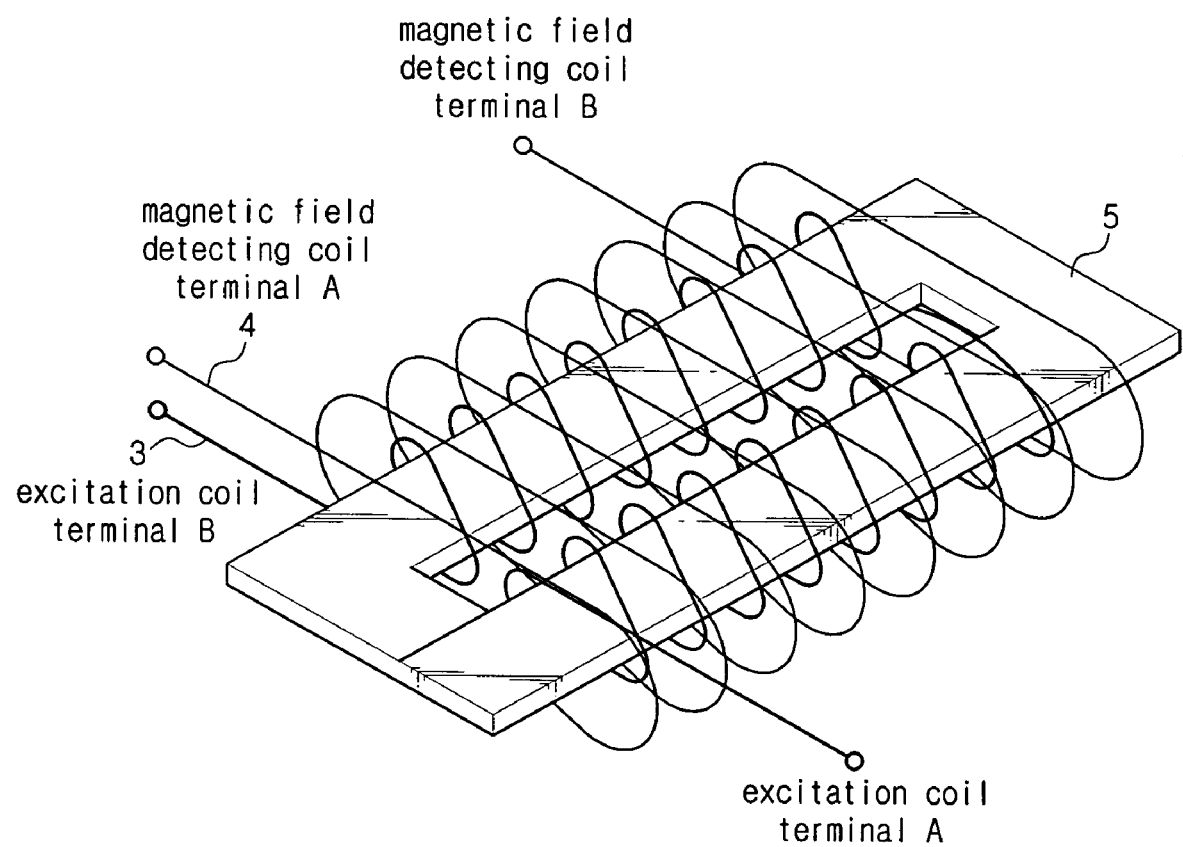
FIG. 6 illustrates a plan view of a rectangular-ring type amorphous magnetic core, i.e., being formed in a rectangular-ring shape, with an excitation coil individually winding two longer sides of the rectangular-ring type amorphous magnetic core, and a magnetic field detecting coil winding the two longer sides of the rectangular-ring type amorphous magnetic core together.
Figure 7:
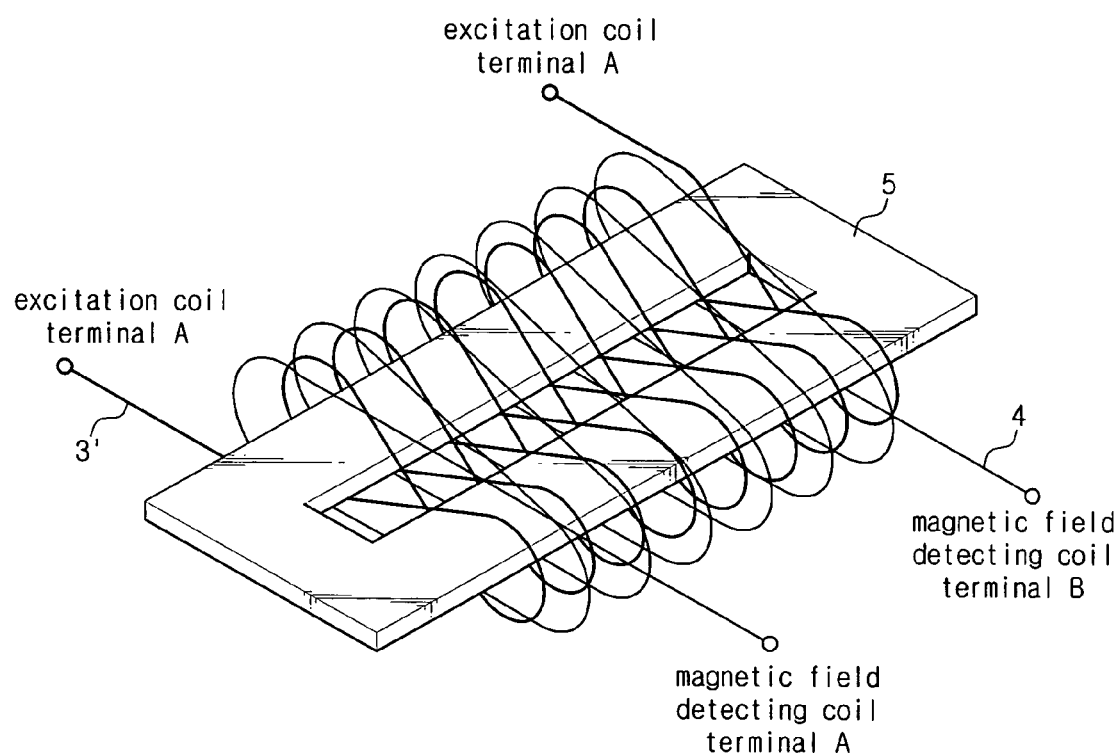
FIG. 7 illustrates a plan view of a rectangular-ring type amorphous magnetic core with an excitation coil winding two longer sides of the rectangular-type amorphous magnetic core in a figure-eight pattern, and a magnetic field detecting coil winding the two longer sides of the rectangular-type amorphous magnetic core together.

In an alternate configuration of the present invention, the first and second amorphous magnetic cores 1, 2 of FIG. 2 may take a form of a rectangular ring, i.e., a rectangular-ring type amorphous magnetic core, as shown in FIGS. 6 and 7. FIG. 6 illustrates a plan view of a rectangular-ring type amorphous magnetic core 5, i.e., being formed in a rectangular-ring shape, with an excitation coil 3 individually winding two longer sides of the rectangular-ring type amorphous magnetic core 5, and a magnetic field detecting coil 4 winding the two longer sides of the rectangular-ring type amorphous magnetic core 5 together. FIG. 7 illustrates a plan view of a rectangular-ring type amorphous magnetic core 5 with an excitation coil 3' winding two longer sides of the rectangular-type amorphous magnetic core 5 in a figure-eight pattern, and a magnetic field detecting coil 4 winding the two longer sides of the rectangular-type amorphous magnetic core 5 together. The configurations shown in FIGS. 6 and 7 vary only in arrangement of the excitation coil and are substantially similar to the previously-described embodiments with respect to the remaining construction and principles of operation.

With the above description, since an amorphous magnetic film having superior permeability and coercive force is formed on a silicon substrate to produce a core, it is possible to manufacture a fluxgate sensor having a higher sensitivity than that of a conventional fluxgate sensor made of silicon. In addition, the present invention may manufacture a thinner and lighter micro fluxgate sensor by utilizing a micromachining technique, without utilizing a layering technique of a printed circuit board.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A micro fluxgate sensor, comprising:
    an amorphous magnetic core formed on a wafer on which a seed layer is deposited;
    an excitation coil wound around the amorphous magnetic core;
    a magnetic field detecting coil wound around the excitation coil and the amorphous magnetic core;
    a protective film formed on the excitation coil and the magnetic field detecting coil; and
    a plurality of pads that are formed between the excitation and magnetic field detecting coils to external terminals to connect therebetween by etching the protective film, each of the pads exposing a portion of one of the excitation coil and the magnetic field detecting coil, and each of the pads corresponding to a via-hole in the protective film,
    wherein each of the plurality of pads overlaps an upper and a lower portion of one of the excitation coil and the magnetic field detecting coil, and
    wherein the upper portion is disposed above the amorphous magnetic core and the lower portion is disposed below the amorphous magnetic core.

2. The micro fluxgate sensor as claimed in claim 1, wherein the amorphous magnetic core is two bar-type amorphous magnetic core.

3. The micro fluxgate sensor as claimed in claim 1, wherein the amorphous magnetic core is formed in a rectangular ring shape.

4. The micro fluxgate sensor as claimed in claim 2, wherein the excitation coil is wound around the two bar-type amorphous magnetic cores in a substantially figure-eight pattern.

5. The micro fluxgate sensor as claimed in claim 3, wherein the excitation coil is wound around the amorphous magnetic core, which is formed in the rectangular ring shape, in a substantially figure-eight pattern.

6. A method of manufacturing a micro fluxgate sensor, comprising:
    forming lower coils of an excitation coil and a magnetic field detecting coil on a wafer;
    depositing a first insulating layer on the lower coils and forming an amorphous magnetic core;
    depositing a second insulating layer on the amorphous magnetic core and forming upper coils connected to the lower coils to complete the excitation coil and the magnetic field detecting coil;
    covering the excitation coil and the magnetic field detecting coil with a protective film; and
    etching the protective film to expose a portion of each of the excitation coil and the magnetic field detecting coil, thereby forming a plurality of pads between the excitation and magnetic field detecting coils to external terminals to connect therebetween.

7. The method as claimed in claim 6, wherein the amorphous magnetic core is two bar-type amorphous magnetic cores.

8. The method as claimed in claim 6, wherein forming the lower coils of the excitation coil and the magnetic field detecting coil on the wafer comprises:
    cleaning the wafer and forming a first seed layer;
    forming a first photoresist film pattern on the first seed layer;
    electroplating a coil material between the first photoresist film patterns; and removing the first photoresist film pattern so that the coil material remains, thereby forming the lower coils of the excitation coil and magnetic field detecting coil.

9. The method as claimed in claim 8, wherein the coil material is copper (Cu).

10. The method as claimed in claim 6, wherein depositing the first insulating layer on the lower coils and forming the amorphous magnetic core comprises:
etching the first seed layer on which the first photoresist film pattern is removed;
depositing a first insulating layer on the etched portion of the first seed layer and the lower coils;
bonding an amorphous magnetic film to the first insulating layer;
forming a second photoresist film pattern on the amorphous magnetic film;
removing the amorphous magnetic film, with a portion protected by the second photoresist film pattern remaining; and
removing the second photoresist film pattern to form the amorphous magnetic core.

11. The method as claimed in claim 10, wherein the amorphous material comprises cobalt (Co) having a DC permeability of about 100,000.

12. The method as claimed in claim 6, wherein depositing a second insulating layer on the amorphous magnetic core and forming upper coils connected to the lower coils to complete the excitation coil and the magnetic field detecting coil comprises:
depositing a second insulating layer on the amorphous magnetic core and the first insulating film;
depositing a second seed layer on the second insulating layer;
forming a via hole extending to the lower coil through the second seed layer and the second insulating layer;
forming a third photoresist film pattern on the second seed layer;
electroplating the coil material between the third photoresist film patterns to connect the coil material with the lower coil through the via hole; and
removing the third photoresist film pattern so that the coil material remains, thereby completing the excitation coil and magnetic field detecting coil.

13. The method as claimed in claim 6, wherein covering the coils with the protective film and forming the pad comprises:
etching the second seed layer from which the third photoresist film pattern has been removed;
depositing a third insulating layer on the etched portion of the second seed layer and the upper coil to form the protective film; and
patterning the protective film to expose a portion of the upper coil to form the pad.

14. The method as claimed in claim 6, wherein the amorphous magnetic core is formed in a rectangular ring shape.

15. The method as claimed in claim 10, wherein the amorphous magnetic core is formed in a rectangular ring shape.

16. The method as claimed in claim 6, wherein the excitation coil is wound around the amorphous magnetic core in a substantially figure-eight pattern.

17. The micro fluxgate sensor as claimed in claim 1, wherein the amorphous magnetic core comprises cobalt (Co) having a DC permeability of about 100,000.

18. The micro fluxgate sensor as claimed in claim 1, wherein the seed layer is in direct contact with the wafer and the lower portion of one of the excitation coil and the magnetic field detecting coil.

19. The micro fluxgate sensor as claimed in claim 1, wherein the seed layer is continuous along a direction perpendicular to a lengthwise direction of the amorphous magnetic core.

20. The micro fluxgate sensor as claimed in claim 1, wherein the seed layer is connecting horizontally adjacent lower portions of one of the excitation coil and the magnetic field detecting coil.

* * * * *